United States Patent
Rostan et al.

(10) Patent No.: US 11,715,806 B2
(45) Date of Patent: Aug. 1, 2023

(54) METHOD FOR FABRICATING A SOLAR MODULE OF REAR CONTACT SOLAR CELLS USING LINEAR RIBBON-TYPE CONNECTOR STRIPS AND RESPECTIVE SOLAR MODULE

(71) Applicant: REC SOLAR PTE. LTD., Singapore (SG)

(72) Inventors: Philipp Johannes Rostan, Singapore (SG); Robert Wade, Korntal (DE); Noel G. Diesta, Singapore (SG); Shankar Gauri Sridhara, Singapore (SG); Anders Soreng, Singapore (SG)

(73) Assignee: REC SOLAR PTE. LTD., Singapore (SG)

( * ) Notice: Subject to any disclaimer, the term of this patent is extended or adjusted under 35 U.S.C. 154(b) by 24 days.

(21) Appl. No.: 17/471,294

(22) Filed: Sep. 10, 2021

(65) Prior Publication Data
US 2022/0020888 A1    Jan. 20, 2022

Related U.S. Application Data

(60) Continuation of application No. 16/551,405, filed on Aug. 26, 2019, now Pat. No. 11,183,606, which is a
(Continued)

(30) Foreign Application Priority Data
Sep. 11, 2012    (GB) ..................... 1216209

(51) Int. Cl.
*H01L 31/05*    (2014.01)
*H01L 31/0224*    (2006.01)
(Continued)

(52) U.S. Cl.
CPC ...... *H01L 31/0516* (2013.01); *H01L 31/0201* (2013.01); *H01L 31/02245* (2013.01);
(Continued)

(58) Field of Classification Search
CPC ............. H01L 31/0516; H01L 31/0201; H01L 31/188
See application file for complete search history.

(56) References Cited

U.S. PATENT DOCUMENTS 6,703,555 B2    3/2004  Takabayashi et al.
9,153,713 B2   10/2015  Zhang et al.
(Continued)

FOREIGN PATENT DOCUMENTS

CN    102132421 A    7/2011
CN    102208486 A   10/2011
(Continued)

OTHER PUBLICATIONS

Chinese Office Action dated Nov. 28, 2016 Application No. 201380047251.9, a corresponding foreign application of U.S. Appl. No. 14/422,131, Rostan et al. "Method for fabricating a solar module of rear contact solar cells using linear ribbon-type connector strips and respective solar module", 22 pages.
(Continued)

*Primary Examiner* — Moazzam Hossain
(74) *Attorney, Agent, or Firm* — Lee & Hayes, P.C.

(57) ABSTRACT

A solar module and a method for fabricating a solar module comprising a plurality of rear contact solar cells are described. Rear contact solar cells (1) are provided with a large size of e.g. 156×156 mm$^2$. Soldering pad arrangements (13, 15) applied on emitter contacts (5) and base contacts (7) are provided with one or more soldering pads (9, 11) arranged linearly. The soldering pad arrangements (13, 15) are arranged asymmetrically with respect to a longitudinal axis (17). Each solar cell (1) is then separated into first and
(Continued)

second cell portions (19, 21) along a line (23) perpendicular to the longitudinal axis (17). Due to such cell separation and the asymmetrical design of the soldering pad arrangements (13, 15), the first and second cell portions (19, 21) may then be arranged alternately along a line with each second cell portion (21) arranged in a 180°-orientation with respect to the first cell portions (19) and such that emitter soldering pad arrangements (13) of a first cell portion (19) are aligned with base soldering pad arrangements (15) of neighboring second cell portions (21), and vice versa. Simple linear ribbon-type connector strips (25) may be used for interconnecting the cell portions (19, 21) by soldering onto the underlying aligned emitter and base soldering pad arrangements (13, 15). The interconnection approach enables using standard ribbon-type connector strips (25) while reducing any bow as well as reducing series resistance losses.

6 Claims, 3 Drawing Sheets

Related U.S. Application Data continuation of application No. 15/383,444, filed on Dec. 19, 2016, now Pat. No. 10,396,227, which is a division of application No. 14/422,131, filed as application No. PCT/IB2013/001964 on Sep. 10, 2013, now Pat. No. 9,660,121.

(60) Provisional application No. 61/699,584, filed on Sep. 11, 2012.

(51) Int. Cl.
*H01L 31/068* (2012.01)
*H01L 31/02* (2006.01)

(52) U.S. Cl.
CPC ...... *H01L 31/0508* (2013.01); *H01L 31/0682* (2013.01); *Y02E 10/547* (2013.01)

(56) References Cited

U.S. PATENT DOCUMENTS

| | | |
|---|---|---|
| 9,455,302 B2 | 9/2016 | Lee et al. |
| 2007/0068567 A1 | 3/2007 | Rubin et al. |
| 2007/0137692 A1 | 6/2007 | Carlson |
| 2009/0038671 A1 | 2/2009 | Yamaguchi |
| 2009/0050190 A1 | 2/2009 | Nishida et al. |
| 2009/0272419 A1 | 11/2009 | Sakamoto et al. |
| 2010/0024881 A1 | 2/2010 | Hacke et al. |
| 2010/0243028 A1* | 9/2010 | Sainoo .......... H01L 31/18 174/262 |
| 2010/0276772 A1 | 11/2010 | Ozaki et al. |
| 2010/0294352 A1 | 11/2010 | Srinivasan et al. |
| 2011/0005582 A1 | 1/2011 | Szlufcik et al. |
| 2011/0057283 A1 | 3/2011 | Tsunemi et al. |
| 2011/0174355 A1 | 7/2011 | Biro et al. |
| 2011/0192456 A1 | 8/2011 | Hang et al. |
| 2012/0133015 A1 | 5/2012 | Tsunemi et al. |
| 2012/0211049 A1 | 8/2012 | Kobamoto et al. |
| 2012/0312358 A1 | 12/2012 | Yamashita et al. |
| 2013/0098423 A1 | 4/2013 | Shimasaki et al. |
| 2013/0112262 A1 | 5/2013 | Thaidigsmann et al. |
| 2013/0263908 A1* | 10/2013 | Zhu .......... H01L 31/18 438/66 |
| 2014/0034108 A1 | 2/2014 | Sakamoto et al. |
| 2020/0058815 A1 | 2/2020 | Rostan et al. |

FOREIGN PATENT DOCUMENTS

| | | |
|---|---|---|
| CN | 102445668 A | 5/2012 |
| CN | 102544167 A | 7/2012 |
| CN | 102544210 A | 7/2012 |
| CN | 103367509 A | 10/2013 |
| DE | 102010024307 A1 | 12/2011 |
| EP | 2105970 A1 | 9/2009 |
| EP | 2184785 A1 | 5/2010 |
| EP | 2410574 A2 | 1/2012 |
| JP | 2000-164901 A | 6/2000 |
| JP | 2008-060205 A | 3/2008 |
| JP | 2009-44049 A | 2/2009 |
| JP | 2009-59921 A | 3/2009 |
| JP | 2011-91316 A | 5/2011 |
| JP | 2012-182408 A | 9/2012 |
| JP | 2013-084930 A | 5/2013 |
| KR | 10-2011-0123312 A | 11/2011 |
| WO | WO2006123938 A1 | 11/2006 |
| WO | WO2008078741 A1 | 4/2010 |
| WO | WO2010097268 A2 | 9/2010 |
| WO | WO2011011855 A1 | 2/2011 |
| WO | WO2011067338 A2 | 6/2011 |
| WO | WO2011081808 A2 | 7/2011 |
| WO | WO2011134691 A2 | 11/2011 |
| WO | WO2011154033 A2 | 12/2011 |
| WO | WO2012021750 A1 | 2/2012 |
| WO | WO2012026806 A1 | 3/2012 |
| WO | WO2012031371 A1 | 3/2012 |
| WO | WO2012031649 A1 | 3/2012 |
| WO | WO2012059534 A2 | 5/2012 |
| WO | WO2012001815 A1 | 8/2013 |

OTHER PUBLICATIONS

Chinese Office Action dated Mar. 29, 2016 in related Application No. 201380047251.9, a corresponding foreign application of U.S. Appl. No. 14/422,131, Rostan et al. "Method for fabricating a solar module of rear contact solar cells using linear ribbon-type connector strips and respective solar module", 2 pages.
European Office Action dated Nov. 9, 2017 in EP Application No. 13803203.2, a corresponding foreign application of U.S. Appl. No. 14/422,131, Rostan et al. "Method for fabricating a solar module of rear contact solar cells using linear ribbon-type connector strips and respective solar module", 6 pages.
European Search report and Written Opinion dated Feb. 14, 2014 in EP Application No. 13803203.2, a corresponding foreign application of U.S. Appl. No. 14/422,131, Rostan et al. "Method for fabricating a solar module of rear contact solar cells using linear ribbon-type connector strips and respective solar module", 6 pages.
International Preliminary Report on Patentability and Written Opinion dated Mar. 17, 2015 in PCT Application No. PCT/IB2013/001964, 14 pages.
International Search Report dated Mar. 20, 2014 in PCT Application No. PCT/IB2013/001964, 4 pages.
Translated Japanese Notice of Allowance dated Jun. 26, 2018, a corresponding foreign application of U.S. Appl. No. 14/422,131, Rostan et al. "Method for fabricating a solar module of rear contact solar cells using linear ribbon-type connector strips and respective solar module", 5 pages.
Translated Japanese Office Action dated Jan. 9, 2018 in JP Application No. 2015-530506, a corresponding foreign application of U.S. Appl. No. 14/422,131, Rostan et al. "Method for fabricating a solar module of rear contact solar cells using linear ribbon-type connector strips and respective solar module", 10 pages.
Translated Japanese Office Action dated May 15, 2018 in JP Application No. 2015-530506, a corresponding foreign application of U.S. Appl. No. 14/422,131, Rostan et al. "Method for fabricating a solar module of rear contact solar cells using linear ribbon-type connector strips and respective solar module", 7 pages.
Translated Japanese Office Action dated Jul. 18, 2017 in JP Application No. 2015-530506, a corresponding foreign application of U.S. Appl. No. 14/422,131, Rostan et al. "Method for fabricating a solar module of rear contact solar cells using linear ribbon-type connector strips and respective solar module", 6 pages.
U.S. Office Action for U.S. Appl. No. 16/551,405, dated Feb. 25, 2021, Rostan, "Method for Fabricating a Solar Module of Rear

(56) References Cited

OTHER PUBLICATIONS

Contact Solar Cells Using Linear Ribbon-Type Connector Strips and Respective Solar Module ", 12 Pages.
U.S. Office Action dated Feb. 12, 2016 in U.S. Appl. No. 14/422,131, Rostan et al. "Method for fabricating a solar module of rear contact solar cells using linear ribbon-type connector strips and respective solar module", 13 pp.
U.S. Office Action dated Aug. 30, 2018 in U.S. Appl. No. 15/383,444, Rostan et al. "Method for fabricating a solar module of rear contact solar cells using linear ribbon-type connector strips and respective solar module", 13 pp.
Van Kerschaver, et al. "Record high performance modules based on screen printed MWT solar cells," May 19, 2002, Inonference Record of the Twenty-Ninth IEEE Photovoltaic Specialists Conference, 2002. pp. 78-81.

\* cited by examiner

METHOD FOR FABRICATING A SOLAR MODULE OF REAR CONTACT SOLAR CELLS USING LINEAR RIBBON-TYPE CONNECTOR STRIPS AND RESPECTIVE SOLAR MODULE

CROSS REFERENCE TO RELATED APPLICATIONS

This Application is a continuation of U.S. application Ser. No. 16/551,405 filed Aug. 26, 2019, issued as U.S. Pat. No. 11,183,606 on Aug. 26, 2019, which is a continuation of U.S. application Ser. No. 15/383,444 filed Dec. 19, 2016, issued as U.S. Pat. No. 10,396,227 on Aug. 27, 2019, which is a divisional of U.S. application Ser. No. 14/422,131, filed on Feb. 17, 2015, issued as U.S. Pat. No. 9,660,121 on May 23, 2017, which is the National Phase of PCT International Application No. PCT/IB2013/001964 filed on Sep. 10, 2013, which claims priority under 35 U.S.C. § 119(e) to U.S. Provisional Application No. 61/699,584, filed on Sep. 11, 2012 and under 35 U.S.C. § 119(a) to Great Britain Patent Application No. 1216209.5 filed on Sep. 11, 2012, all of which are hereby expressly incorporated by reference into the present application.

FIELD OF THE INVENTION

The present invention relates to a method for fabricating a solar module of rear contact solar cell solar cells, particularly of metal wrap-through (MWT) solar cells, and to a corresponding solar module.

TECHNICAL BACKGROUND

Solar cells are used to convert sunlight into electricity using a photovoltaic effect. A general object is to achieve high conversion efficiency balanced by a need for low production costs.

In a solar cell, emitter regions and base regions are comprised in a semiconductor substrate and a junction between these oppositely doped regions serves for separating light-generated charge couples. Therein, an emitter region comprises one of n-type and p-type doping whereas a base region comprises the opposite doping type.

In conventional solar cells, the emitter region is typically arranged at a top surface directed towards the impinging light and the base region is arranged at the opposite rear surface of the semiconductor substrate. Accordingly, emitter contacts contacting the emitter region are arranged on the front side and base contacts contacting the base region are arranged on the rear side of the semiconductor substrate.

Novel cell designs have been developed wherein both contact types are arranged on a rear surface of the semiconductor substrate. Such solar cells are typically referred to as rear contact solar cells.

One type of rear contact solar cells which will be mainly discussed herein is the metal wrap-through (MWT) solar cell design in which an emitter region is formed at the front side of the semiconductor substrate and small metal fingers are arranged on this front side to form emitter contacts. However, in contrast to conventional solar cells, these small metal fingers do not lead to larger fingers, arranged perpendicular to the small fingers and typically referred to as busbars. Instead, these small fingers lead to through-holes generated all over the area of the semiconductor substrate. These through-holes are filled with metal thereby connecting the small front side fingers with an emitter contact region arranged on the rear surface of the semiconductor substrate. Accordingly, the MWT-cell may have both contact types on the rear surface such that no light-shading busbars are needed on the front side.

On each of the emitter contacts and base contacts on the rear side surface, soldering pad arrangements may be applied. These soldering pad arrangements may comprise one or more soldering pads made with a solderable material such as e.g. silver. On top of such soldering pads, interconnecting structures may be soldered for interconnecting neighboring solar cells thereby forming interconnected strings of solar cells which may then be used for finally forming a solar module.

Several concepts and interconnection schemes have been developed for electrically interconnecting a plurality of rear contact solar cells. General requirements to be fulfilled by such approaches and schemes are that no short-circuits shall occur between emitter regions and base regions via the applied interconnection structures. Furthermore, the interconnecting structures shall be easy to be applied to the soldering pad arrangements without significant risk of damaging the solar cell by the interconnection procedure. Furthermore, processing steps and materials used for interconnecting solar cells to a string should be as simple and cheap as possible.

SUMMARY OF THE INVENTION

Embodiments of the present invention enable to fulfill the above-mentioned requirements in an advantageous manner.

According to a first aspect of the present invention, a method for fabricating a solar module is proposed. The method starts with providing a plurality of rear contact solar cells having emitter contacts and base contacts on a rear surface of a semiconductor substrate and soldering pad arrangements applied on emitter contacts and on base contacts. Each soldering pad arrangement comprises one or more soldering pads arranged linearly. The soldering pad arrangements are arranged on the rear surface of the semiconductor substrate asymmetrically with respect to a longitudinal axis of the semiconductor substrate. As will become clearer further below, such asymmetrical arrangement of the soldering pad arrangements may be seen as an important idea for the inventive concept. The longitudinal axis of the semiconductor substrate may be an axis which extends through a center of the semiconductor substrate and which may be preferably parallel to or at least not crossing the linear extension of the soldering pad arrangements.

After having prepared or provided such specifically designed rear contact solar cells, each of the solar cells is separated into first and second cell portions along a line perpendicular to the longitudinal axis of the semiconductor substrate.

Subsequently, the plurality of first and second cell portions of the rear contact solar cells is arranged alternately along a line such that the second cell portions are arranged in a 180°-orientation with respect to the first cell portions and such that soldering pad arrangements of emitter contacts and of base contacts of first cell portions are aligned with soldering pad arrangements of base contacts and emitter contacts of second cell portions, respectively. In other words, after separating each solar cell into two portions, every second cell portion is rotated by 180° and the cell portions are then arranged along a line.

Due to the asymmetry of the arrangement of the soldering pad arrangements on the rear surface of the semiconductor substrate, the first cell portions and the rotated second cell portions may be arranged such that each soldering pad arrangement applied on top of emitter contacts of a first cell portion is linearly aligned with an associated soldering pad arrangement applied on base contacts of a neighboring second cell portion. Similarly, each soldering pad arrangement applied on base contacts of the first cell portion may be linearly aligned with an associated soldering pad arrangement applied on emitter contacts of a second cell portion neighboring on the other side.

Finally, the plurality of first and second cell portions is electrically connected in series. For this purpose, a linear ribbon-type connector strip is arranged on top of a linear soldering pad arrangement of an emitter contact of each first cell portion and on top of an aligned linear soldering pad arrangement of a base contact of a second cell portion neighboring the respective first cell portion on one side. Furthermore, a linear ribbon-type connector strip is arranged on top of a linear soldering pad arrangement of a base contact of the respective first cell portion and on top of an aligned linear soldering pad arrangement of an emitter contact of a second cell portion neighboring the respective first cell portion on an opposite side.

Finally, the connector strips are electrically connected to the underlying soldering pad arrangements.

According to a second aspect of the present invention, a solar module is proposed. The solar module may be fabricated by the above-described method. The solar module comprises a plurality of first and second cell portions of rear contact solar cells arranged along a longitudinal axis. Each of the first and second cell portions comprises soldering pad arrangements on top of each of emitter contacts and base contacts which soldering pad arrangements each comprise one or more soldering pads arranged linearly. The soldering pad arrangements are arranged on the rear side of the semiconductor substrate asymmetrically with respect to a longitudinal axis of the semiconductor substrate. The plurality of first and second cell portions of the rear contact solar cells are arranged alternately along a line such that the second cell portions are arranged in a 180°-orientation with respect to the first cell portions and such that soldering pad arrangements of emitter contacts and of base contacts of the first cell portions are aligned with soldering pad arrangements of base contacts and of emitter contacts of the second cell portions, respectively. The plurality of first and second cell portions of the rear contact solar cells are connected in series by linear ribbon-type connector strips each being arranged on top of a linear soldering pad arrangement of an emitter contact of each first cell portion and on top of an aligned linear soldering pad arrangement of a base contact of a second cell portion neighboring the respective first cell portion on one side and by linear ribbon-type connector strips each being arranged on top of a linear soldering pad arrangement of a base contact of the respective first cell portion and on top of an aligned linear soldering pad arrangement of an emitter contact of a second cell portion neighboring the respective first cell portion on an opposite side.

As will become apparent in more details further below, the above aspects of the present invention may be understood as relying on the following ideas and observations:

In prior approaches and schemes for interconnecting rear contact solar cells for fabricating a solar module, the requirement of avoiding short-circuits and of easy and cheap interconnection techniques have been fulfilled in various ways.

For example, complex metal interconnection structures have been provided by printing metal pastes onto additional substrates such as flexible foils and subsequently applying these additional substrates on top of the semiconductor substrate for interconnecting the emitter and base contacts of neighboring solar cells in a suitable manner. However, such approach requires the provision of additional substrates for carrying the printed metal structures and furthermore requires substantial efforts and costs for printing the metal structures onto such substrates.

In an alternative approach, ribbon-type connector strips have been used for interconnecting neighboring solar cells. However, in such approach, either no simple linear ribbon-type connector strips but connector strips with a complex shape had to be used or additional insulating layers had to be interposed between each of the connector strips and underlying emitter and base contacts for preventing local short-circuits.

Additionally, particularly in case of large solar cells, soldering a ribbon-type connector strip to soldering pad arrangements on a semiconductor substrate may result in significant bowing of the semiconductor substrate due to the differing thermal expansion coefficients of the material of the connector strip and the material of the semiconductor substrate. Such bowing may result in reduced yield of the fabrication process.

According to aspects of the present invention, a rear contact solar cell may be provided in a large size. Preparing solar cells with large size is more efficient than preparing such solar cells with smaller sizes. For example, at the moment, wafer-based solar cells are typically prepared with sizes of 156×156 $mm^2$. Such large sized rear contact solar cells are provided with specific soldering pad arrangements wherein each soldering pad arrangement comprises one or more soldering pads and has a linear shape. The soldering pad arrangements are provided on the rear side of the semiconductor substrate such as to be asymmetrical with respect to a longitudinal axis of the semiconductor substrate. Specifically, the soldering pad arrangements are provided in a scheme such that, when arranging a first solar cell next to a second solar cell in a 180°-orientation, the linear soldering pad arrangement of one type, i.e. contacting emitter contacts or base contacts, of the first cell is linearly aligned with an associated soldering pad arrangement of the other type on the second cell. Due to such specific design of the soldering pad arrangements, each solar cell may then be separated into first and second cell portions by cutting e.g. along a line perpendicular to the longitudinal axis of the semiconductor substrate and, subsequently, these first and second cell portions may be arranged alternately along a line with each second cell portion being arranged at 180°-orientation with respect to first cell portions. Finally, the first and second cell portions may be interconnected using conventional linear ribbon-type connector strips applied on top of a linear soldering pad arrangement of a first type on a first cell portion and an aligned linear soldering pad arrangement of an opposite second type on a neighboring second cell portion. Due to separating the large sized rear contact solar cell before interconnection, shorter ribbon-type connector strips may be used resulting in reduced bow.

Accordingly, the approach presented herein allows using simple linear ribbon-type connector strips for interconnecting rear contact solar cells and at the same time prevents excessive bowing of the semiconductor substrates upon interconnection and, furthermore, prevents any necessity for insulation layers interposed between connector strips and contacts.

According to an embodiment of the present invention, no insulation layer is interposed between each of the connector strips and the emitter and base contacts. The presented interconnection concept allows preventing short-circuits without needing any insulation layer between the connector strips and the underlying surface of the semiconductor substrate. Accordingly, additional efforts and costs for providing such insulation layers may be prevented.

According to another embodiment of the invention, before separating a rear contact solar cell, the soldering pad arrangement of an emitter contact continuously extends from a first end arranged close to a first edge of the semiconductor substrate via a center region of the semiconductor substrate to a second end arranged close to a second edge of the semiconductor substrate, wherein the first end and the second end are spaced apart from the first edge and the second edge, respectively, by between 2 and 48%, preferably between 4 and 20% of the distance between the first and second edges. Similarly, in the finalized solar module, i.e. after separating the rear contact solar cell into first and second portions, the soldering pad arrangement of an emitter contact continuously extends from a first end arranged close but spaced to a first edge of a cell portion to a second end arranged at an opposite second edge of the cell portion, wherein the first end is spaced apart from the first edge by between 4 and 96%, preferably between 8 and 40° of the distance between the first and second edges.

In other words, the design of the soldering pad arrangements applied to emitter contacts may be chosen such that, before separating the solar cell into two portions, the soldering pad arrangements may extend close to but spaced apart from opposite edges of the semiconductor substrate, i.e. there remains at least a small gap between an end of a soldering pad arrangement and a neighboring edge of the semiconductor substrate. This gap may serve for transmitting electrical currents from base regions arranged on one side of the emitter soldering pad arrangement to base regions arranged on an opposite side of this emitter soldering pad arrangement. The extension of the emitter soldering pad arrangement on the rear surface of an MWT solar cell typically strongly depends on the design of the front side emitter contacts and on the arrangements of through-holes for interconnecting the front side emitter contacts with the rear side emitter soldering pad arrangement. In an extreme design, the through-holes could be arranged only close to the centre of solar cell substrate such that the emitter soldering pad arrangement may be arranged only in a limited region near to the centre of the substrate and a gap between such soldering pad arrangement and an edge of the substrate may be up to 48% of the entire substrate width. Generally, the shorter the emitter soldering pad arrangements is and, thus, the larger the gap to the substrate edge is the smaller a series resistance is for electrical currents in the base to flow from a base region on the opposite side of the emitter soldering pad arrangement towards a collecting base soldering pad arrangement. However, as short emitter soldering pad arrangements may be only achieved in combination with longer emitter contact fingers on the front side of the solar cell substrate, such longer emitter contact fingers possibly resulting in increased series resistance, a trade-off may have to be found with emitter soldering pad arrangements leaving a gap to a substrate edge with gap dimensions of 4-20% of the cell substrate width.

However, as the emitter soldering pad arrangement extends continuously via the center region of the semiconductor substrate and the semiconductor substrate will be separated into two portions by cutting through this center region, in the resulting first and second cell portions, the emitter soldering pad arrangement will reach directly up to the edge on one side of the cell portions while leaving a gap to the edge on the other side of the cell portions. Due to such design of the soldering pad arrangements on the cell portions, the cell portions may be interconnected with each other without needing any insulation layers for preventing short-circuits.

Current collection from base regions towards a base soldering arrangement may be further improved by providing additional metal fingers extending from a soldering pad arrangement of a base contact arranged on one side of the continuous soldering pad arrangement of an emitter contact via the gap between the continuous soldering pad arrangement of the emitter contact and the edge to a region at an opposite side of the continuous soldering pad arrangement of the emitter contact.

The proposed fabrication method and solar module may be particularly beneficial when applied to rear contact solar cells having a square size of more than 100×100 mm$^2$, particularly a size of 156×156 mm$^2$, which means that the separated first and second cell portions are rectangular and have a size of preferably more than 50×100 mm$^2$. Particularly for such large size solar cells, the step of separating the solar cell into first and second cell portions and then specifically orientating and aligning these first and second cell portions is beneficial as without such process step, excessive bowing of the semiconductor substrate upon soldering the ribbon-type connector strips to the soldering pad arrangements could significantly reduce fabrication yield.

In order to separate the rear contact solar cells into first and second cell portions, a linear trench may be laser-scribed into the semiconductor substrate and subsequently the semiconductor substrate may be mechanically broken along this trench. While such separation process may be easily realized for industrial scale production, other methods for separating the rear contact solar cell into halves may also be applied.

It may be noted that possible features and advantages of embodiments of the present invention are described herein with respect to the proposed fabrication method or with respect to the proposed solar module. One skilled in the art will recognize that the various features may be suitably combined or exchanged and features of the fabrication method may be realized in a corresponding manner in the solar module and vice versa in order to implement further advantageous embodiments and possibly realize synergy effects.

BRIEF DESCRIPTION OF THE DRAWINGS

In the following, features and advantages of embodiments of the present invention will be described with respect to the enclosed drawings. However, neither the drawings nor the description shall be interpreted as limiting the invention.

Figure 1:
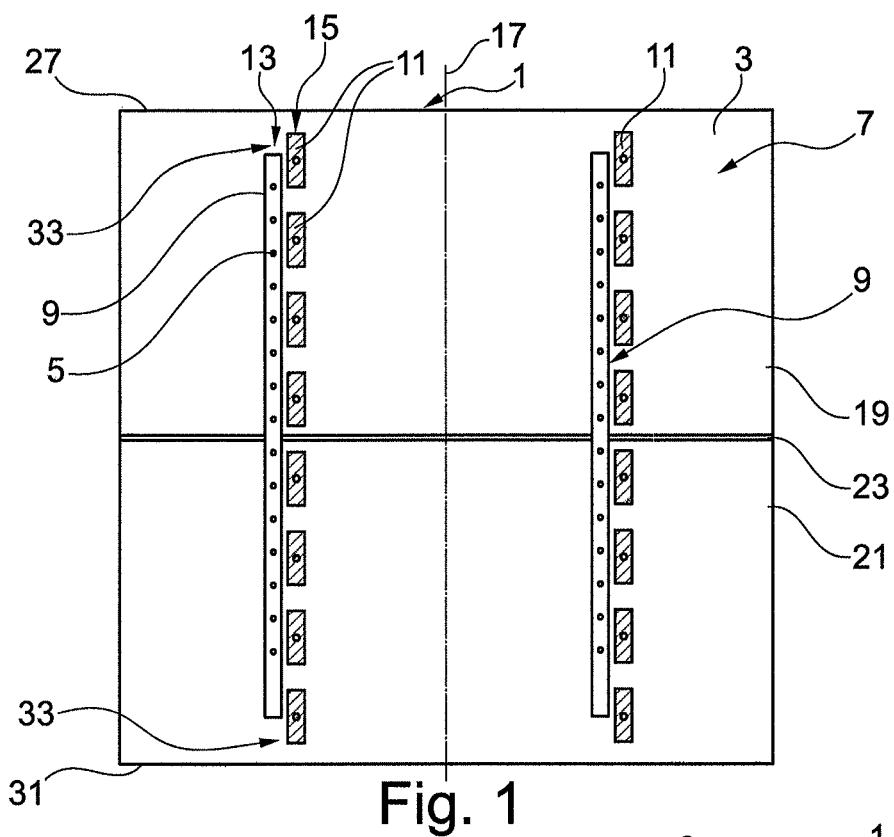
FIGS. 1 and 2 show top views on a rear side surface of rear contact solar cells which may be used for fabrication methods and solar modules according to embodiments of the present invention.

The figures are only schematically and not to scale. Same or similar features are designated with same reference signs throughout the figures.

DESCRIPTION OF PREFERRED EMBODIMENTS

Embodiments of a fabrication method and a solar module according to the present invention shall be described in the following with regard to an exemplary embodiment of metal wrap-through (MWT) solar cells. However, the proposed method and solar module may also be applied to other rear contact solar cells such as e.g. emitter wrap-through (EWT) solar cells, interdigitated back contact (IBC) solar cells, etc.

Various techniques and approaches for fabricating MWT solar cells and interconnecting a plurality of such MWT solar cells for fabricating a solar module have been developed. An overview may be found for example in Florian Clement: "Die Metal Wrap Through Solarzelle—Entwicklung und—Charakterisierung" (electronically published on http://www.freidok.uni-freiburg.de/volltexte/6832/).

One of the main problems of state-of-the-art MWT solar cell technology is the complexity and cost of manufacturing a module. Frequently, additional foils carrying complex patterns of printed metal structures thereon are used for interconnecting neighboring solar cells within a solar module. For conventional ribbon-type interconnection, either additional process steps such as application of insulating layers have to be applied or specific non-linear ribbons have to be used or an amount of ribbons for interconnecting emitter and base contacts is uneven. While applying additional insulating layers or using complex shaped ribbon-type interconnectors may add to processing complexity and costs, the provision of an uneven number of ribbons interconnecting emitter and base contacts may result in non-homogeneous distribution of electrical current flow within the solar cell, finally resulting in reduced solar cell efficiency.

Furthermore, while using ribbon-type connector strips for interconnecting solar cells in a module in principle may include many advantages like using well-established technology for soldering such connector strips to soldering pads of the solar cell, cheap availability of simple connector strips, etc., using ribbon-type connector strips on rear contact solar cells of a large size such as the currently common standard size of 156 mm×156 mm may result in tremendous bow induced by the ribbons. The metal material of the ribbons and the semiconductor material of the solar cell significantly differ in their thermal expansion coefficient. During a soldering process, temperatures of around 200° C. may be reached, resulting in thermally induced stress when cooling down. Due to such mechanical stress, the semiconductor substrate may significantly bend to a concave form. The induced bowing is proportional, inter alia, to the length of the ribbon-type connector strips, their cross-section and to a contact area between the strips and the solar cell. The induced bowing may be mainly responsible for mechanical yield losses during solar module fabrication. For example, in standard size solar cells of 156×156 mm$^2$, using ribbon-type connector strips of dimensions of 2 mm×0.1 mm may result in an excessive bow of more than 4 mm. For connector strips having even larger cross-section of 3.5 mm×0.3 mm, as they can be beneficially used for reducing serial resistances in the connector strips, excessive bowing of even more than 9 mm may be observed. However, in standard solar module fabrication, a bow of 2-3 mm is regarded to be the maximum allowable in mass production to avoid yield loss due to breakage during ribbon stringing and lamination.

Accordingly, prior to the present invention, is was assumed that using ribbon-type connector strips for interconnecting rear contact solar cells was no option for solar module fabrication from large sized solar cells. This is particularly true as MWT solar cells typically provide 2-3% higher electrical currents compared to standard solar cells with busbars on the front side such that any reduction of the cross-section of the ribbon-type connector strips would result in even severe series resistance problems.

With the fabrication method as well as the solar module proposed herein, the above-mentioned problems may be solved or at least significantly relaxed. The proposed approach allows using simple linear ribbon-type connector strips for interconnecting rear contact solar cells. While the entire solar cell may be produced with a large size thereby enabling using established high-through-put industrial solar cell processing, it is proposed to applying a specific asymmetrical pattern of soldering pad arrangements on the rear side surface of a semiconductor substrate and separating each rear contact solar cell into at least two cell portions before arranging the cell portions in an alternating manner and in an alternating orientation and finally soldering linear ribbon-type connector strips onto the aligned soldering pad arrangements of neighboring cell portions. Thereby, both the number of connector strips per cell portion as well as the length of connector strips may be reduced thereby reducing any bowing of the semiconductor substrate upon cooling-off after soldering the connector strips to the soldering pad arrangements.

Furthermore, as the size of the cell portions is significantly smaller, preferably half the size of the non-separated rear contact solar cells, the electrical current produced by each cell portion is smaller than in entire rear contact solar cells. Accordingly, power losses due to serial resistance within the connector strips may be reduced by a factor of 4.

Figure 2:
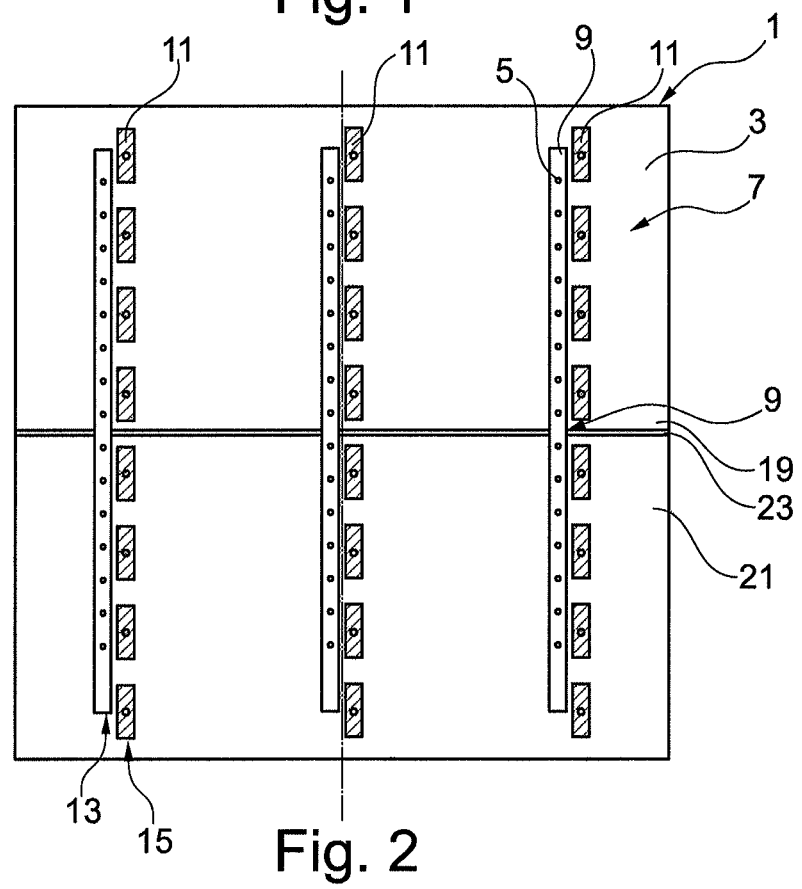

FIGS. 1 and 2 are top views onto rear surfaces of rear contact solar cells with a 2-busbar and 3-busbar design as they may be used for fabricating a solar module according to an embodiment of the present invention.

A square semiconductor substrate 3 of an MWT rear contact solar cell 1 has a size of 156 mm×156 mm. Such MWT solar cell 1 comprises emitter contacts not only on a front surface but emitter contacts are also lead through through-holes 5 to the rear surface of the semiconductor substrate 3. In small areas adjacent to these through-holes 5, soldering pads 9 are arranged on the rear surface of the semiconductor substrate 3. Both the front side emitter contacts as well as the soldering pads 9 contacting the emitter contacts 5 lead through the through-holes towards the rear side of the substrate 3 may be applied using e.g. screen-printing technologies and using e.g. silver-containing screen-printing pastes.

The remainder of the rear surface of the semiconductor substrate 3 apart from the areas of the soldering pads 9 contacting the emitter contacts 5 is covered with a base contact 7 and/or a back surface field layer (BSF). Both the base contacts 7 as well as the back surface field layer may be applied e.g. by screen-printing an aluminium-containing paste onto the entire rear surface of the semiconductor substrate 3 except for the regions of the emitter soldering pads 9. As an aluminium layer may not be soldered, soldering pads 11 comprising a solderable material such as a silver-aluminium compound are arranged on the base contacts 7 locally.

Both the single soldering pad 9 contacting the emitter contacts 5 as well as the multiple soldering pads 11 contacting the base contact 7 form soldering pad arrangements 13, 15 having a linear geometry, i.e. extending along a straight line. Furthermore, as shown in the figures, the linear soldering pad arrangements 13, 15 may extend parallel to a longitudinal axis 17 running through the center of the semiconductor substrate 3.

The soldering pad arrangements 13, 15 are arranged asymmetrical with respect to the longitudinal axis 17. In other words, when mirroring one of the soldering pad arrangements 13, 15 at the longitudinal axis 17, there is no corresponding soldering pad arrangement 13, 15 at the mirrored position but, to the contrary, there is a soldering pad arrangement 15, 13 of the other type at this position.

When fabricating a solar module from a plurality of rear contact solar cells 1 as shown in FIG. 1 or 2, after processing the entire solar cell 1 in its original large size and applying soldering pads 9, 11 at the desired locations, each solar cell 1 is separated into two cell portions 19, 21 along a line 23 perpendicular to the longitudinal axis 17 of the semiconductor substrate 3. Preferably, the separating line 23 is positioned at the middle of the semiconductor substrate 3 such that the two cell portions 19, 21 are halves of the original solar cell 1 and have same sizes.

The solar cell 1 may be separated by first generating a linear trench along the separating line 23 using e.g. a laser. Such separating trench may not go through the entire thickness of the semiconductor substrate 3 but may have a depth of e.g. between 10 and 100 μm. Subsequently, the solar cell 1 may be broken along this trench wherein the trench serves as a predetermined breaking line.

While such separation process using a laser-scribed trench and subsequently mechanically breaking the substrate 3 along this trench appears to provide advantages when incorporated into an industrial scale fabrication procedure, other techniques for separating the solar cell 1 such as sawing, etching, etc. may be applied.

Figure 3:
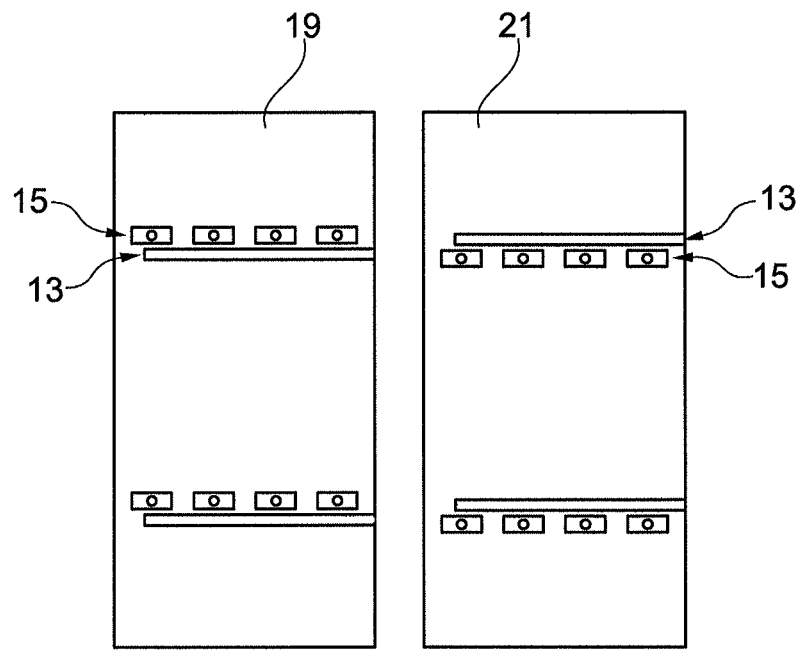
FIG. 3 show a top view onto a rear side surface of specifically oriented cell portions for a solar module to be fabricated according to an embodiment of the present invention.
Figure 4:
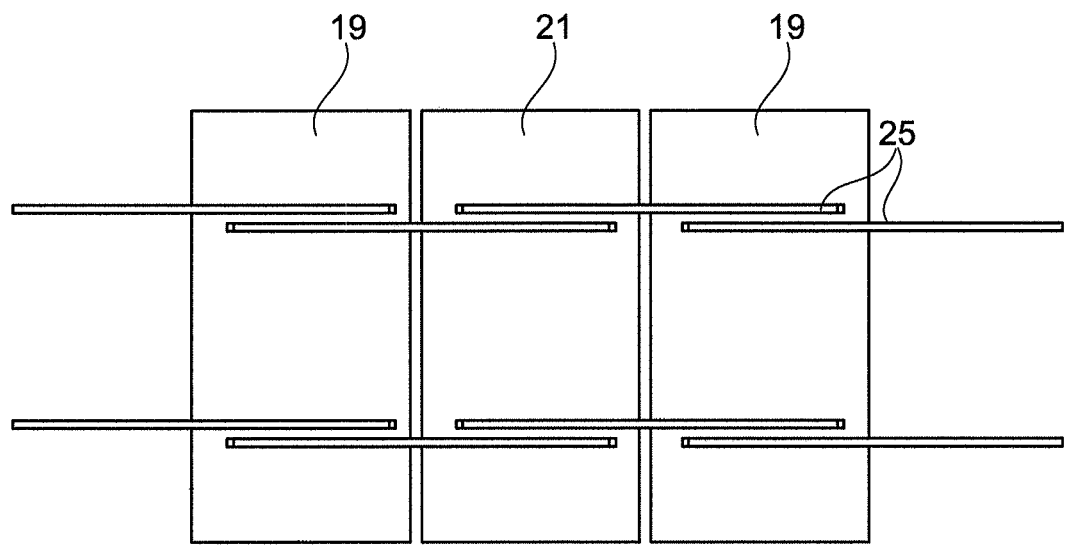
FIG. 4 shows a top view on a rear side surface of interconnected solar cells of a solar module according to an embodiment of the present invention.

After having separated the solar cell 1 into first and second cell portions 19, 21, these first and second cell portions are alternately arranged along a line as schematically shown in FIGS. 3 and 4. Therein, every first cell portion 19 is arranged in a first orientation and the second cell portions 21 arranged at opposite sides of the first cell portion 19 are arranged in an opposite orientation, i.e. rotated by 180°.

Due to such alternating arrangement and orientation of first and second cell portions 19, 21 and due to the specific asymmetrical design of the soldering pad arrangements 13, 15 arranged on the emitter contacts 5 and the base contacts 7, respectively, the cell portions 19, 21 may be arranged such that a soldering pad arrangement 13 of emitter contacts on a first cell portion 19 may be linearly aligned with a soldering pad arrangement 15 of base contacts on a neighboring second cell portion 21, and vice versa, as shown in FIG. 3.

Accordingly, as shown in FIG. 4, linear ribbon-type connector strips 25 may be arranged on top of the aligned soldering pad arrangements 13, 15 of neighboring first and second cell portions 19, 21 and electrically connected thereto for example by a soldering procedure. The connector strip 25 may be a simple linear ribbon as used conventionally for interconnecting solar cells having emitter contacts on a front side and base contacts on a rear side. The ribbons may have a highly conductive copper core enclosed by a solderable material such as silver.

Figure 5:
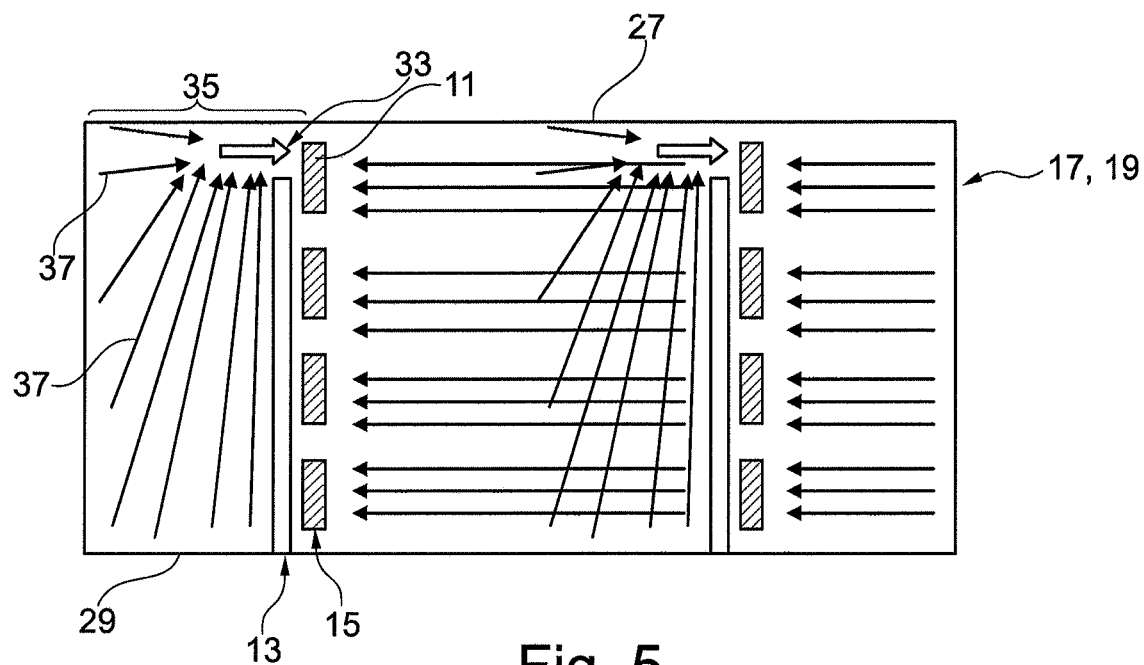
FIGS. 5 and 6 show top views on a rear side surface of cell portions to be used for a fabrication method and a solar module according to alternative embodiments of the present invention.
Figure 6:
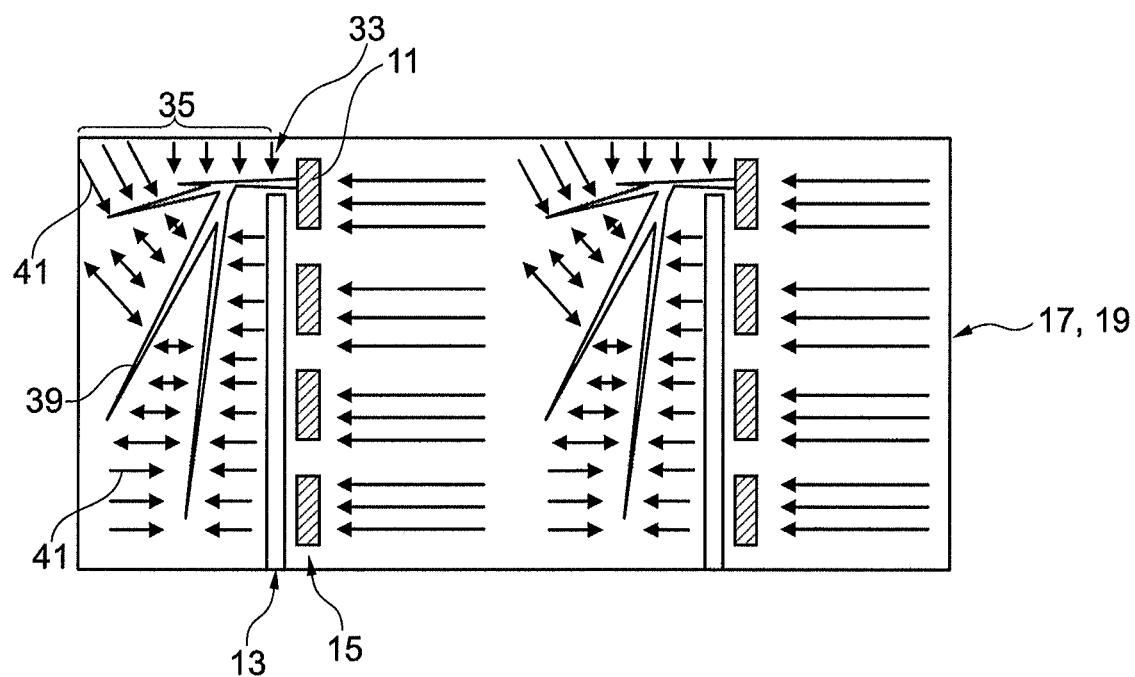

FIGS. 5 and 6 visualize electrical current flow densities within the base on the rear side of a cell portion 17, 19.

As may be seen in FIGS. 1 and 2, the soldering pad arrangements 13 of emitter contacts continuously extend from a first end arranged close to a first edge 27 of the semiconductor substrate 3 to a second end close to a second edge 31 of the semiconductor substrate 3. However, the soldering pad arrangement 13 does not reach directly to the first and second edges 27, 31 but the first and second ends of the soldering pad arrangement 13 is spaced apart from these edges 27, 31 by a certain distance thereby forming a gap 33 between the end of the soldering pad arrangement 13 and the associated edge 27, 31. However, the soldering pad arrangement 13 extends from the first end continuously via a center region to the second end such that it crosses the separation line 23.

Accordingly, as shown in FIGS. 5 and 6, the soldering pad arrangement 13 of the emitter contacts has one end thereof spaced apart from an upper first edge 23 by a gap 33, but reaches a lower opposite edge 29 of the cell portion 17, 19 directly, i.e. without any gap.

Such design of the emitter soldering pad arrangement 13 may have two effects. First, a connector strip 25 arranged on top of the emitter soldering pad arrangement 13 as shown in FIG. 4 has no risk of getting into electrical contact with portions of the base or base contact of the respective cell portion. Thus, there is no risk of short-circuiting. Second, electrical current generated within an area adjacent to the emitter soldering pad arrangement 13 where there are no base soldering pads 11 may flow through the gap 33 towards the base soldering pad arrangement 15 as shown with the arrows 37 in FIG. 5. Accordingly, there is no need of providing base soldering pad arrangements 15 on both sides of an emitter soldering pad arrangement 13.

In order to further improve current collection within the base of the solar cell, additional metal fingers 39 extending from a soldering pad arrangement 15 of a base contact into an area 35 may be provided. Accordingly, these metal fingers 39 extend from the base soldering pad arrangement 15 arranged on the right side of the continuous emitter soldering pad arrangement 13 via the gap 33 into the region 35 at the opposite left side of the continuous emitter soldering pad arrangement 13, thereby shortening any current paths as visualized with the arrows 41. The metal fingers 39 may have a significantly higher electrical conductivity than the base contact or the back surface field provided at the rear surface of the semiconductor substrate 3.

Summarized, the proposed fabrication method and solar module enables cheap and simple cell interconnection using standard linear ribbon-type connector strips while minimizing any bowing of the semiconductor substrate 3 as well as minimizing series resistance losses. A key feature of embodiments of the present invention may be seen in separating a large size rear contact solar cell 1 into portions 17, 19, e.g. by cutting into halves, and providing a specific asymmetrical design for soldering pad arrangements thereby enabling that resulting first and second cell portions 17, 19 may be arranged alternately and aligned with each other such that linear ribbon-type connector strips 25 may be soldered onto associated soldering pad arrangements 13, 15.

It shall be noted that embodiments of the present invention are described herein only with respect to the substantial features and processing steps. One skilled in the art realizes that, in a fabrication method, further processing steps may be added or some of the described processing steps may be replaced by equivalent processing steps for fabricating the solar cell. Similarly, one skilled in the art realizes that the proposed solar cell module may comprise further features and components additional to the features described herein or as equivalent replacements.

Finally, it should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

LIST OF REFERENCE SIGNS 1 rear contact solar cell
3 semiconductor substrate
5 emitter contacts
7 base contacts
9 emitter soldering pad
11 base soldering pads
13 emitter soldering pad arrangement
15 base soldering pad arrangement
17 longitudinal axis
19 first cell portion
21 second cell portion
23 separation line
25 linear ribbon-type connector strip
27 first edge
29 second edge of cell portion
31 second edge of solar cell
33 gap
35 region without base soldering pad arrangement
37 current flow arrows
39 metal fingers
41 current flow arrows

The invention claimed is:

1. A solar module, comprising:
a first cell portion on a semiconductor substrate, the first cell portion comprising a first soldering pad arrangement of emitter contacts and of base contacts;
a second cell portion on the semiconductor substrate, the second cell portion comprising a second soldering pad arrangement of emitter contacts and of base contacts, wherein the first soldering pad arrangement and the second soldering pad arrangement are aligned asymmetrically with respect to an axis of a semiconductor substrate;
the first cell portion separate from the second cell portion along a line perpendicular to an axis of the semiconductor substrate; and
the first cell portion and the second cell portion positioned alternately along a line such that the second cell portion is arranged in an angular orientation with respect to the first cell portion and such that the first soldering pad arrangement of emitter contacts and of base contacts of the first cell portion is aligned with the second soldering pad arrangement of base contacts and of emitter contacts of the second cell portion, respectively.

2. The solar module of claim 1, further comprising electrically connecting the first cell portion and the second cell portion by electrically connecting the base contacts of the first cell portion to the emitter contacts of the second cell portion or connecting the emitter contacts of the first cell portion to the base contacts of the second cell portion.

3. The solar module of claim 1, wherein, before separating a rear contact solar cell, the soldering pad arrangement of an emitter contact continuously extends from a first end arranged close to a first edge of the semiconductors substrate via a centre region of the semiconductor substrate to a second end arranged close to a second edge of the semiconductors substrate, wherein the first end and the second end are spaced apart from the first edge and the second edge, respectively, by between 2 and 48% of the distance between the first and second edges.

4. The solar module of claim 1, wherein the rear contact solar cells are separated into first and second cell portions by mechanically breaking the solar cell along a linear trench.

5. The solar module of claim 4, wherein the linear trench is created by laser scribing into the semiconductor substrate.

6. The solar module of claim 4, wherein the linear trench is created by etching or sawing into the semiconductor substrate.

* * * * *